United States Patent
Mehringer et al.

(10) Patent No.: US 9,310,411 B2
(45) Date of Patent: Apr. 12, 2016

(54) DIAGNOSTIC DEVICE FOR A MULTI-VOLTAGE VEHICLE ELECTRICAL SYSTEM, A MULTI-VOLTAGE VEHICLE ELECTRICAL SYSTEM, AND A METHOD FOR OPERATING A MULTI-VOLTAGE VEHICLE ELECTRICAL SYSTEM

(75) Inventors: Paul Mehringer, Stuttgart (DE); Marc Eschenhagen, Möglingen (DE); Michael Merkle, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/349,299

(22) PCT Filed: Sep. 4, 2012

(86) PCT No.: PCT/EP2012/067213
§ 371 (c)(1),
(2), (4) Date: Jul. 11, 2014

(87) PCT Pub. No.: WO2013/050207
PCT Pub. Date: Apr. 11, 2013

(65) Prior Publication Data
US 2014/0350781 A1  Nov. 27, 2014

(30) Foreign Application Priority Data
Oct. 7, 2011 (DE) .......... 10 2011 084 139
Aug. 31, 2012 (DE) .......... 10 2012 215 542

(51) Int. Cl.
*G01R 31/02* (2006.01)
*B60R 16/023* (2006.01)
(Continued)

(52) U.S. Cl.
CPC . *G01R 31/02* (2013.01); *B60L 1/00* (2013.01); *B60R 16/0232* (2013.01); *B60R 16/03* (2013.01); *G06N 99/005* (2013.01); *G01R 19/14* (2013.01); *G01R 31/006* (2013.01)

(58) Field of Classification Search
CPC ......... B60L 1/00; B60L 1/003; B60L 3/0069; B60L 11/1868; B60R 16/0231; B60R 16/0232; B60R 16/03; B60R 16/0307; G01R 31/02; G01R 31/006; G01R 19/14; G06N 99/005; B60W 20/20; B60W 20/50
See application file for complete search history.

(56) References Cited

U.S. PATENT DOCUMENTS 7,365,516 B2 * 4/2008 Leyten et al. ................. 320/116
2005/0068003 A1 * 3/2005 Gauthier et al. ............. 320/104
(Continued)

FOREIGN PATENT DOCUMENTS

DE  199 61 622   6/2001
DE  100 02 537   7/2001
(Continued)

OTHER PUBLICATIONS

International Search Report for PCT/EP2012/067213, dated Jan. 2, 2013.

*Primary Examiner* — Jerrah Edwards
*Assistant Examiner* — Tamara Weber
(74) *Attorney, Agent, or Firm* — Kenyon & Kenyon LLP

(57) ABSTRACT

A diagnostic device is provided for a multi-voltage electrical system of a motor vehicle which has a first subnetwork acted on by a first voltage and a second subnetwork acted on by a second voltage, the first voltage being higher than the second voltage, and the first and the second subnetwork having a shared ground connection. The diagnostic device includes a second ground connection, a measuring unit configured to measure a current flow via the second ground connection, and a diagnostic unit configured to diagnose a disturbance in the shared ground connection and/or in the second ground connection on the basis of the measured current flow via the second ground connection as a function of at least one operating state of the vehicle electrical system.

9 Claims, 3 Drawing Sheets

(51) Int. Cl.
- *B60L 1/00* (2006.01)
- *B60R 16/03* (2006.01)
- *G06N 99/00* (2010.01)
- *G01R 31/00* (2006.01)
- *G01R 19/14* (2006.01)

(56) References Cited

U.S. PATENT DOCUMENTS

| | | | |
|---|---|---|---|
| 2005/0259371 A1* | 11/2005 | Henze et al. | 361/44 |
| 2006/0261843 A1* | 11/2006 | Kraft et al. | 324/771 |
| 2010/0244849 A1* | 9/2010 | Yano et al. | 324/510 |
| 2011/0011659 A1* | 1/2011 | Sailor et al. | 180/65.245 |
| 2012/0208672 A1* | 8/2012 | Sujan et al. | 477/5 |

FOREIGN PATENT DOCUMENTS

| | | |
|---|---|---|
| DE | 101 38 477 | 2/2003 |
| EP | 1 453 171 | 9/2001 |
| EP | 1 143 254 | 10/2001 |
| EP | 1143254 A1 | 10/2001 |
| FR | 2 729 901 | 8/1996 |
| FR | 2 904 695 | 2/2008 |
| WO | WO 01/47084 | 6/2001 |

* cited by examiner

DIAGNOSTIC DEVICE FOR A MULTI-VOLTAGE VEHICLE ELECTRICAL SYSTEM, A MULTI-VOLTAGE VEHICLE ELECTRICAL SYSTEM, AND A METHOD FOR OPERATING A MULTI-VOLTAGE VEHICLE ELECTRICAL SYSTEM

BACKGROUND OF THE INVENTION

1. Field of the Invention

The present invention relates to a protective and/or diagnostic device for a multi-voltage electrical system of a motor vehicle, a corresponding multi-voltage vehicle electrical system, and a method for operating a multi-voltage vehicle electrical system.

2. Description of the Related Art

Multi-voltage electrical systems for motor vehicles are known in general. They are used because a single voltage supply is often no longer sufficient due to the increasing number of electrical consumers in motor vehicles and/or consumers having different nominal voltages are used. Multi-voltage vehicle electrical systems typically include subnetworks having different voltage levels of 12 V and 42 V, for example. It is also known to connect subnetworks via one DC/DC converter, so that they may be supplied via a shared generator.

Within the scope of this application, dual-voltage vehicle electrical systems, i.e., multi-voltage vehicle electrical systems having only two subnetworks of different voltage levels, are predominantly considered. The present invention is, however, not limited to dual-voltage vehicle electrical systems, as elucidated below.

The subnetworks are frequently connected to one shared ground conductor. In practice, this is not easily preventable, since electrical machines, for example, which have their ground connection via the housing and a mechanical connection via the internal combustion engine, would otherwise have to be insulated electrically against the internal combustion engine. An electrical insulation of this type in a place which is subjected to great mechanical stresses is, however, associated with considerable complexity, since the material properties of an insulating material are not always reconcilable with the mechanical requirements.

However, a problem arises due to the shared ground connection if the shared ground wire is disrupted. In this case, a polarity reversal of the electrical consumers may occur in a subnetwork having a lower voltage level, as elucidated below in conjunction with FIG. 1.

To protect against such a polarity reversal, published German patent application document DE 199 61 622 A1 proposes in the case of a dual-voltage vehicle electrical system, which has two electrically connected subnetworks of different voltage levels in which electrical consumers are situated, to place a protective diode into the vehicle electrical system having the lower voltage level in parallel to the electrical consumers.

In this way, the polarity reversal voltage of the electrical consumers is limited to the conducting-state voltage of the diode in the event of a grounding fault. A fuse which is coordinated with the maximum current intensity of the diode may be situated in the vehicle electrical system having the lower voltage level. A similar approach using a protective diode is disclosed in published German patent application document DE 101 38 477 A1.

Published international patent application document WO 01/47084 A1 proposes the use of a voltage measuring device in order to recognize an overvoltage in a subnetwork having the lower voltage level. If this voltage measuring device recognizes an overvoltage, the consumers relevant in this case are disconnected from the network. Published European patent application document EP 1 453 171 A1 proposes corresponding switching means for the consumers' protection.

However, the measures known from the related art frequently prove to be complex and ineffective. Therefore, the need continuously exists to provide possibilities of reliably recognizing and/or preventing a polarity reversal of consumers in the case explained above.

BRIEF SUMMARY OF THE INVENTION

Against this background, the present invention proposes a protective and/or diagnostic device for a multi-voltage electrical system of a motor vehicle, a corresponding multi-voltage vehicle electrical system, and a method for operating a corresponding multi-voltage vehicle electrical system.

With the aid of the approach proposed according to the present invention, a polarity reversal of a subnetwork having the lower voltage level (also referred to in the following as a "low-voltage network") may be reliably recognized and/or prevented in a corresponding multi-voltage vehicle electrical system having subnetworks of different voltage levels. For this purpose, at least one other ground connection, in particular in a subnetwork of the higher voltage level (also referred to in the following as a "high-voltage network"), is also provided in addition to a first shared ground connection. A current flow is measured and diagnosed via this at least one other ground connection. The approach according to the present invention is based on the finding that due to the parasitic activities in the particular components of the vehicle electrical system in the case of two or more ground connections which are situated accordingly, the current flows via these ground connections characteristically become pronounced in different operating states of the vehicle electrical system and offer diagnostic possibilities.

In other words, the present invention proposes to provide at least one other redundant ground connection, namely in particular in a subnetwork of higher voltage. Here, the placement preferably takes place in an existing component in the high-voltage network (also referred to in the following as a "high-voltage component"). This component is advantageously a generator, in particular a starter generator, which is situated on an internal combustion engine of a motor vehicle and which is conductively connected to this motor vehicle via a housing, for example. As elucidated below, a connection may, however, also take place directly on an internal combustion engine.

The at least one other ground connection is in this case equipped with a current estimation device (referred to as a "measuring means" within the scope of this application) which is configured to measure a current, which flows via the at least one other ground connection, and to check it for plausibility as a function of an operating state with the aid of also provided diagnostic means, as elucidated below. In this way, a disruption or another type of interruption of one of the ground connections is already recognizable and a polarity reversal of a vehicle electrical system may be reliably prevented.

With the aid of the measures proposed according to the present invention, an alternative is provided to an electrical insulation of corresponding high- or low-volt components against an internal combustion engine. An electrical insulation in places which are subjected to great mechanical stresses, which, as mentioned above, is frequently only possible with great effort, may thus be dispensed with.

As already mentioned above, the present invention is based on the fact that characteristic current distribution patterns form due to the parasitic activities in the components of the vehicle electrical system during different operating states. Such current distribution patterns become pronounced in particular during high currents, so that a diagnosis according to the present invention advantageously takes place in particular during starting operations of an internal combustion engine. Here, there is a considerable difference between a so-called cold or initial start and a so-called warm start. This is explained below in greater detail, in particular in conjunction with FIGS. 3 and 4.

The measures according to the present invention are in this case particularly employable in motor vehicles in which during a cold start, the start of the internal combustion engine takes place with the aid of a so-called pinion starter, i.e., a starter motor which is connected to a subnetwork having a low voltage level, i.e., the low-voltage network. During a warm start, however, the start of an internal combustion engine takes place in such systems with the aid of a motor-driven starter generator in the high-voltage network.

In one particularly advantageous specific embodiment, it is provided that one other ground connection and one shared ground connection are connected in parallel in such a way that the currents flowing via the starter and the starter generator flow via the shared ground connection and the other ground connection, when the internal combustion engine is started in the event of an undisrupted shared ground connection and an undisrupted other ground connection.

It is particularly advantageous that the other ground connection and the shared ground connection are connected in parallel in such a way that during a cold start with the aid of the starter motor, a larger portion of the occurring currents flows via the shared ground connection and the remaining, smaller portion of the occurring currents flows via the other ground connection.

Furthermore or alternatively, it is advantageous that the other ground connection and the shared ground connection are connected in parallel in such a way that during a warm start with the aid of the starter generator, a larger portion of the occurring currents flows via the other ground connection and the remaining, smaller portion of the occurring currents flows via the shared ground connection.

It may advantageously be provided to ascertain the corresponding currents in each case during regular operation with the aid of a learning function for different operating states of the motor vehicle and to store them in diagnostic means, for example. In other words, a protective and/or diagnostic device according to the present invention will continuously measure and store currents during regular operation. If the currents measured via the at least one other ground connection deviate from the stored currents, it may be assumed that at least one of the ground connections is disrupted. In this context, corresponding threshold values or tolerance ranges may be used.

Although the present invention is largely described here with reference to vehicle electrical systems having two subnetworks, the finding according to the present invention that in the case of multiple ground connections, characteristic current distribution patterns become pronounced in different operating states due to the parasitic activities present in a vehicle electrical system, may also be used in vehicle electrical systems having more than two subnetworks, i.e., in multi-voltage vehicle electrical systems in general. The provision of multiple other ground connections is also possible and reasonable, since a redundant diagnosis is made possible in this way.

An arithmetic unit according to the present invention, e.g., a control unit of a motor vehicle, is designed to carry out a method according to the present invention, in particular from a programming point of view. The elucidated diagnostic means may, in particular, be implemented as part of a corresponding control unit.

In one particularly advantageous aspect of the present invention, the other ground connection is situated directly on the generator, and the elucidated diagnostic means are implemented as part of an activation of the generator, in particular integrated into the generator. In this way, the wiring is particularly simple.

In one particularly advantageous aspect of the present invention, the other ground connection is situated directly on the starter generator, and the elucidated diagnostic means are implemented as part of an activation of the starter generator, in particular integrated into the starter generator. In this way, the wiring is particularly simple.

It is also advantageous to implement the protective and/or diagnostic method in the form of software, since this is particularly cost-effective, in particular when an executing control unit is used for other tasks and is thus present anyway. Suitable data carriers for providing the computer program are, in particular, floppy disks, hard drives, flash memories, EEPROMs, CD-ROMs, DVDs, and many others. It is also possible to download a program via computer networks (Internet, Intranet, etc.).

The present invention is schematically illustrated in the drawing on the basis of an exemplary embodiment and is described in greater detail below with reference to the drawing.

BRIEF DESCRIPTION OF THE INVENTION

Figure 1:
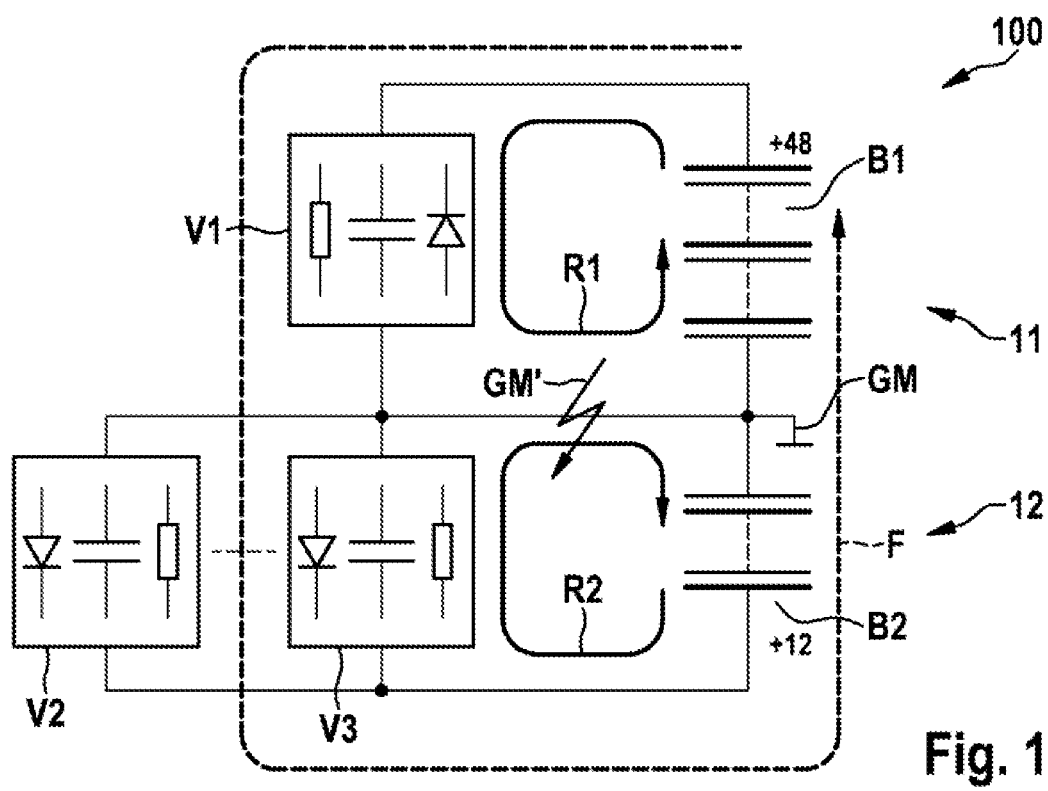
FIG. 1 shows a dual-voltage vehicle electrical system during regular and fault operations in a highly schematic representation.

FIG. 1 shows a dual-voltage vehicle electrical system in a highly schematic representation which is designated by reference numeral 100 as a whole. A regular operation having an intact ground connection GM and a fault operation having a disrupted, e.g., interrupted, ground connection GM' are illustrated.

Dual-voltage vehicle electrical system 10 has two subnetworks 11, 12, of which a first subnetwork 11 represents the subnetwork of higher voltage and another subnetwork 12 represents the subnetwork of low voltage.

Subnetwork 11 has a first energy store B1, e.g., a lithium-ion accumulator, a capacitive store, or a conventional vehicle battery. First energy store B1 provides, for example, a voltage of +48 V and is connected on its ground side to a shared ground connection GM. In first subnetwork 11, a first consumer V1 is situated which is symbolized by a simplified equivalent circuit diagram. During regular operation, a regular current flow R1 results in first subnetwork 11.

The other subnetwork 12 also includes an energy store B2 and consumers V2 and V3. Energy store B2 may be implemented as energy store B1 elucidated above and supplies a lower voltage, e.g., a voltage of +12 V, than energy store B1. During regular operation, a regular current flow R1 results in second subnetwork 12.

If an interruption of the ground connection to shared ground connection GM takes place, as illustrated by the arrow designated with reference symbol GM', fault current F flows, due to which the polarity of consumers V2 and V3 situated in the other subnetwork 12 is reversed and they are acted on by a corresponding polarity reversal voltage of 36 Volts.

Figure 2:
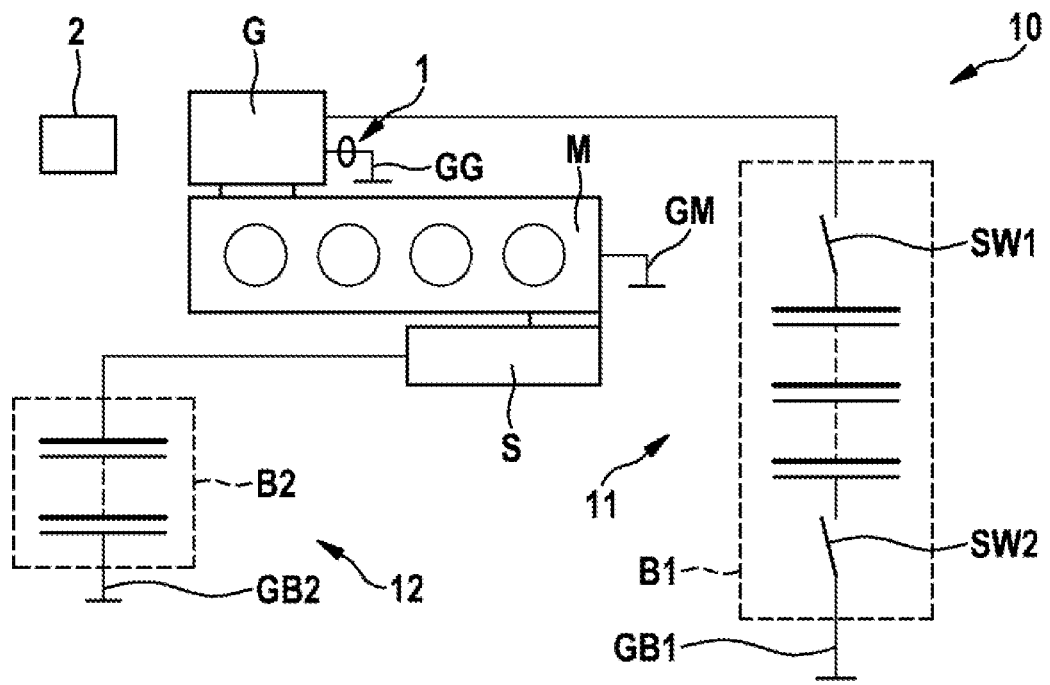
FIG. 2 shows a dual-voltage vehicle electrical system having a protective and/or diagnostic device according to one particularly preferred specific embodiment of the present invention in a schematic representation.

FIG. 2 shows a dual-voltage vehicle electrical system having a protective and/or diagnostic device 1 according to one particularly preferred specific embodiment of the present invention and also designated with reference numeral 10 as a whole. Dual-voltage vehicle electrical system 10 includes those components which were already elucidated in conjunction with FIG. 1, but these components are shown in an alternative representation.

In the dual-voltage vehicle electrical system, first energy store B1 is illustrated in first subnetwork 11, as already elucidated in conjunction with FIG. 1. First energy store B1 is switchably connected via switches SW1 and SW2 and connected to a ground connection GB1. A second energy store B2, as also previously elucidated, is provided in the other subnetwork 12 and connected to a ground connection GB2. The dual-voltage vehicle electrical system includes an internal combustion engine M which is connected to a ground connection GM. Ground connections GM, GB1, and GB2 are generally a shared ground connection. A generator G which is advantageously designed as a startable generator, i.e., as a generator which may be operated by a motor, is connected to internal combustion engine M. Generator G is conductively connected to internal combustion engine M via a housing. The same applies to a starter motor S, e.g., in the form of a pinion starter, which is also conductively connected to internal combustion engine M. Generator G and starter motor S, together with two other components which are not illustrated, are connected to first B1 and second B2 energy stores.

According to the present invention, a protective and/or diagnostic device 1 is provided which may also include corresponding diagnostic and evaluation means 2. Diagnostic and evaluation means 2 may in this case be advantageously provided in a control unit for internal combustion engine M. Protective and diagnostic device 1 monitors another ground connection GG via which a current is measured and may be checked for plausibility as a function of an operating state of the vehicle electrical system or the motor vehicle. As a result, an interruption of one of ground connections GG or GM is detectable and a polarity reversal of the vehicle electrical system may be prevented.

Figure 3:
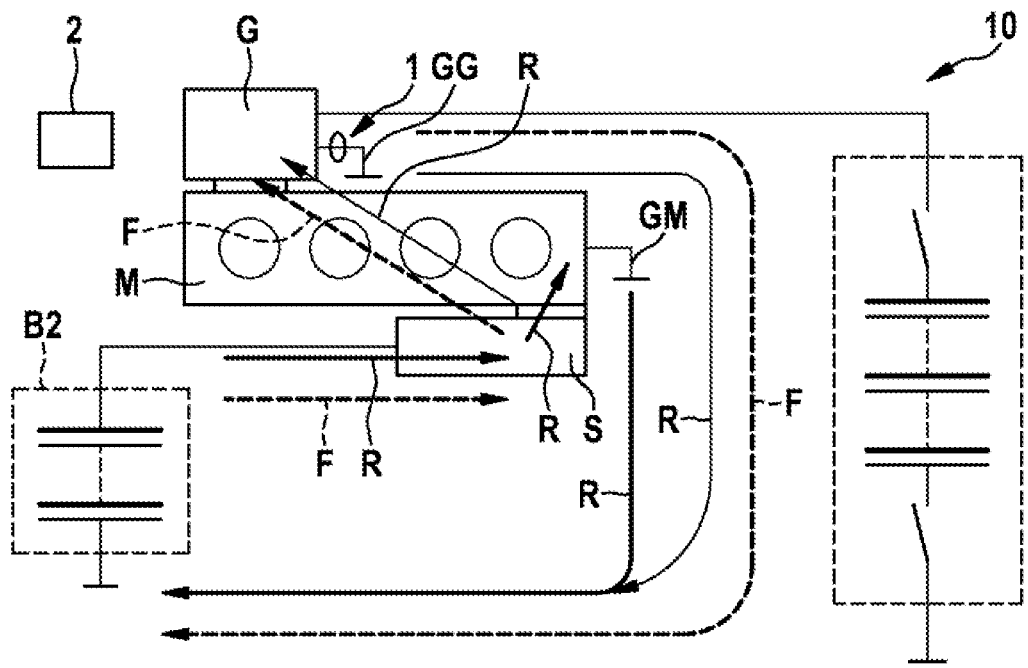
FIG. 3 shows current paths in a dual-voltage vehicle electrical system according to one particularly preferred specific embodiment of the present invention during regular and fault operations in a first operating state.

FIG. 3 shows a current path in a dual-voltage vehicle electrical system according to one particularly preferred specific embodiment of the present invention during a normal and a fault operation in a first operating state, in this case during a cold start of internal combustion engine M with the aid of starter motor S. FIG. 3 includes the essential components of FIG. 2 which are not elucidated here again.

In FIG. 3, fault currents are illustrated using dashed arrows and regular currents, i.e., currents as they occur during regular operation without interrupted ground lines, are illustrated using solid arrows and they are identified by reference symbols F (fault) and R (regular), respectively. The thickness of the arrows corresponds to the flowing current portions or current intensities in each case according to their order of magnitude.

Due to the parasitic activities, which are elucidated below in greater detail in conjunction with FIG. 5, in the components of dual-voltage vehicle electrical system 10, a larger portion (as illustrated by the thick solid arrow) of the occurring currents flows at the start (with the aid of starter motor S) of internal combustion engine M during regular operation, i.e., in the case of undisturbed ground connection GM, via second energy store B2, starter motor S, a motor block of internal combustion engine M, and shared ground connection GM. A smaller portion flows via ground connection GG of protective and diagnostic device 1.

In the event of an error which, as mentioned above, is illustrated by dashed arrows and in which shared ground connection GM is disrupted, a current flows from second energy store B2 via starter motor S, internal combustion engine M, generator 1, and ground connection GG.

In this way, it may be determined at the start (with the aid of starter motor S) of internal combustion engine M that an interruption in the ground connection of internal combustion engine G has occurred if a correspondingly high current flows via the at least second ground connection of the protective and diagnostic device. A corresponding evaluation device 2 may have threshold value functions in this case which define a maximum threshold value for a "permissible" current via the other ground connection GG.

Figure 4:
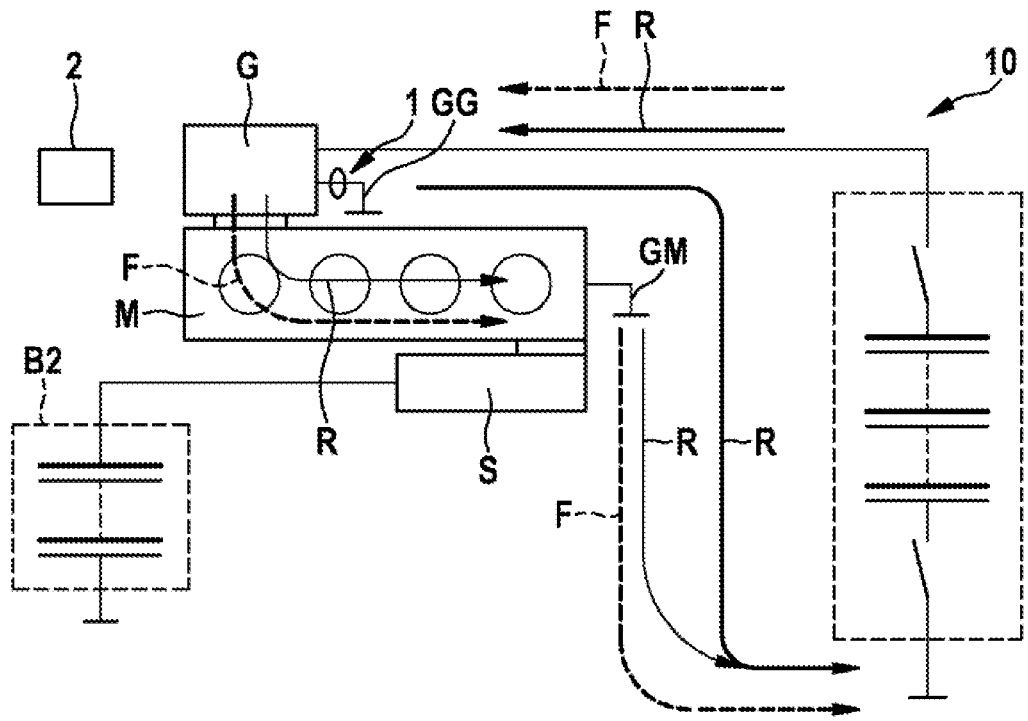
FIG. 4 shows current paths in a dual-voltage vehicle electrical system according to one particularly preferred specific embodiment of the present invention during regular and fault operations in a second operating state.

FIG. 4 shows a current path in a dual-voltage vehicle electrical system according to one particularly preferred specific embodiment of the present invention during a normal and a fault operation in a second operating state, in this case for a warm start of internal combustion engine M with the aid of (motor-driven) generator G. Here, too, the essential components correspond to those of FIGS. 2 and 3, so they are not elucidated again.

In the case of a warm start, an interruption of the connection may be detected via the other ground connection GG. During regular operation, also illustrated here by solid arrows of corresponding thickness, a larger portion of the currents flows via shared ground connection GM due to the parasitic activities present in the components of the vehicle electrical system and only a comparatively small portion flows via the other ground connection GG. In the event of an error in which an interruption has occurred in the other ground connection GG, the entire current flows via shared ground connection GM. A reduction of a current via the other ground connection GG compared to an "expected" value therefore allows an error to be correspondingly diagnosed in the other ground connection GG.

Overall, appropriate measures may thus be taken in the event of an interruption or disruption either in shared ground connection GM or in the other ground connection GG, i.e., for example, a first energy store of higher voltage may be disconnected from the vehicle electrical system via switch SW1 and/or SW2 in order to prevent a polarity reversal of consumers V2 and V2 from taking place in the low-voltage network.

As elucidated above, the at least one other ground connection GG may be provided at different positions, as long as it is ensured that corresponding characteristic current distribution patterns form. Another ground connection GG may also be provided at internal combustion engine M if the measuring means are implemented accordingly.

Figure 5:
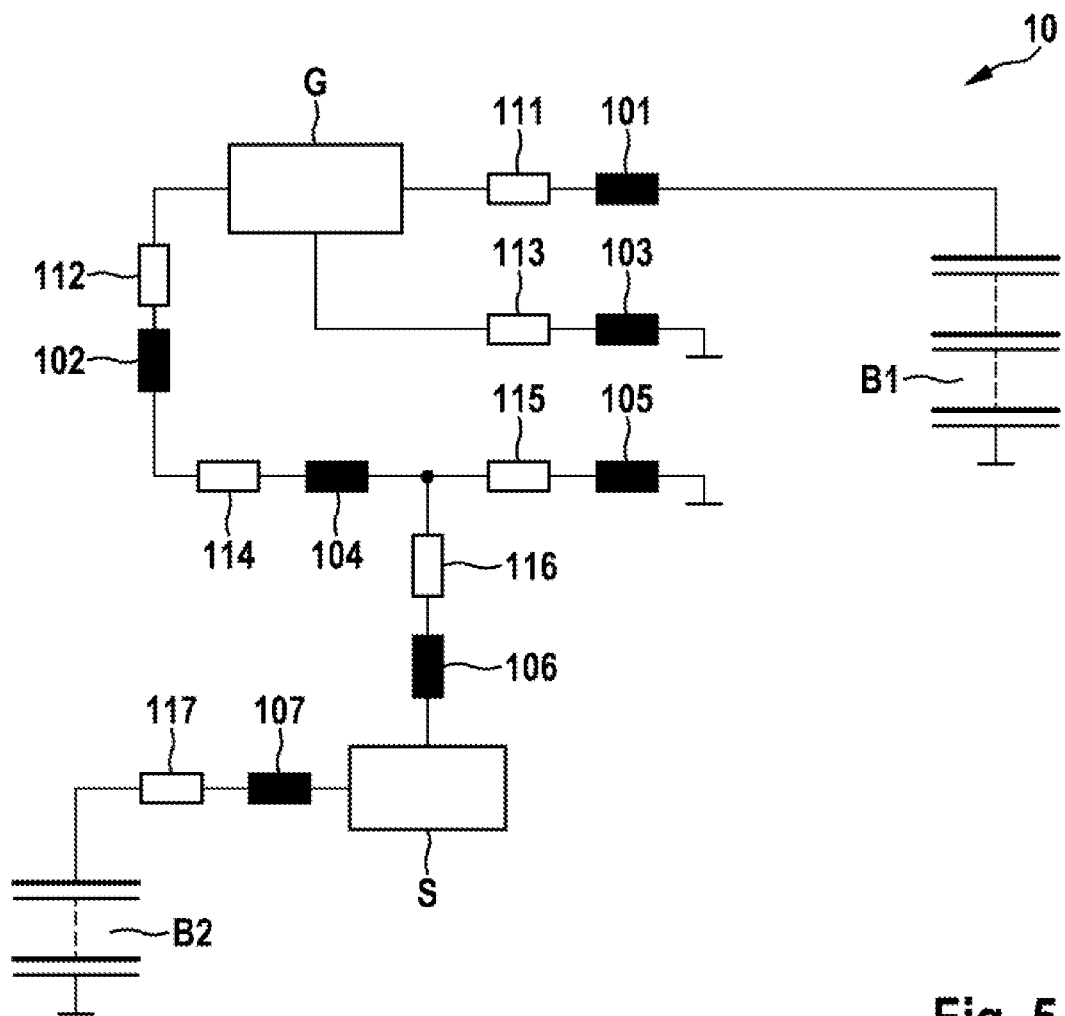
FIG. 5 illustrates parasitic activities in a dual-voltage vehicle electrical system according to one particularly preferred specific embodiment of the present invention in the form of a simplified equivalent circuit diagram.

FIG. 5 shows a purely exemplary dual-voltage vehicle electrical system in the form of an equivalent circuit diagram. The inductances and resistances indicated in each case are summarized in the following table. In sum, they result in the current distribution patterns mentioned above becoming pronounced.

| Element | Value | Explanation |
| --- | --- | --- |
| 101 | 1-5 µH | inductance (L) supply line |
| 102 | 1 nH | L screw connection (generator) |
| 103 | 1 µH | L ground (generator) |
| 104 | 1 nH | L motor block |
| 105 | 200 nH | L ground band |
| 106 | 1 nH | L screw connection (starter motor) |
| 107 | 1-5 µH | L supply line (starter motor) |
| 111 | 2-8 mΩ | resistance (R) supply line |
| 112 | 250 µΩ | R screw connection (generator) |
| 113 | 2.51 mΩ | R ground (generator) |
| 114 | 10 µΩ | R motor block |
| 115 | 1.216 mΩ | R ground band |
| 116 | 250 µΩ | R screw connection (starter motor) |
| 117 | 2-8 mΩ | R supply line (starter motor) |

What is claimed is:

1. A diagnostic device for a multi-voltage electrical system of a motor vehicle having an internal combustion engine, the multi-voltage vehicle electrical system including a first subnetwork acted on by a first voltage and at least one other subnetwork acted on by at least one other voltage, the first voltage being higher than the at least one other voltage, and the first subnetwork and the at least one other subnetwork having a shared first ground connection, the diagnostic device comprising:
at least one second ground connection; and
processing circuitry that is programmed to perform a diagnostic function, wherein:
the diagnostic function includes diagnosing a disturbance in at least one of the shared first ground connection and the at least one second ground connection based on (a) an obtained measurement of a current flow via the at least one second ground connection, and (b) at least one operating state of the multi-voltage vehicle electrical system; and
the at least one second ground connection and the shared first ground connection are connected in parallel such that currents flowing via a starter situated in the second subnetwork and a generator situated in the first subnetwork flow via the shared first ground connection and the at least one second ground connection when the internal combustion engine is started under the conditions of the shared first ground connection being undisrupted and the at least one second ground connection being undisrupted.

2. The diagnostic device as recited in claim 1, wherein the at least one second ground connection and the shared first ground connection are connected in parallel in such a way that during a cold start with the aid of the starter, a larger portion of the flowing currents flows via the shared first ground connection and the remaining, smaller portion of the flowing currents flows via the at least one second ground connection.

3. The diagnostic device as recited in claim 2, wherein:
the generator is a starter generator; and
the at least one second ground connection and the shared first ground connection are connected in parallel in such a way that during a warm start with the aid of the starter generator, a larger portion of the flowing currents flows via the at least one second ground connection and the remaining, smaller portion of the flowing currents flows via the shared first ground connection.

4. The diagnostic device as recited in claim 3, wherein the shared first ground connection is provided on the internal combustion engine of the motor vehicle, and wherein at least one component of the first subnetwork and at least one component of the at least one other subnetwork are connected to the shared first ground connection.

5. The diagnostic device as recited in claim 3, wherein the at least second ground connection is a ground connection of the generator which is conductively connected to the internal combustion engine.

6. The diagnostic device as recited in claim 3, wherein the first voltage is 48 V and the at least one other voltage is one of 12 V or 14 V.

7. The diagnostic device as recited in claim 3, wherein the first subnetwork is acted on by the first voltage with the aid of at least one voltage source, and the at least one other subnetwork is acted on by the at least one other voltage with the aid of at least one other voltage source.

8. A multi-voltage electrical system for a motor vehicle, comprising:
a first subnetwork acted on by a first voltage;
at least one other subnetwork acted on by at least one other voltage, wherein the first voltage is higher than the at least one other voltage, and the first subnetwork and the at least one other subnetwork have a shared first ground connection; and
a diagnostic device including:
at least one second ground connection; and
processing circuitry that is programmed to perform a diagnostic function, wherein:
the diagnostic function includes diagnosing a disturbance in at least one of the shared first ground connection and the at least one second ground connection based on (a) an obtained measurement of a current flow via the at least one second ground connection, and (b) at least one operating state of the multi-voltage vehicle electrical system; and
the at least one second ground connection and the shared first ground connection are connected in parallel such that currents flowing via a starter situated in the second subnetwork and a generator situated in the first subnetwork flow via the shared first ground connection and the at least one second ground connection when the internal combustion engine is started under the conditions of the shared first ground connection being undisrupted and the at least one second ground connection being undisrupted.

9. A method for operating a diagnostic device for a multi-voltage electrical system of a motor vehicle having an internal combustion engine, the multi-voltage vehicle electrical system including a first subnetwork acted on by a first voltage and at least one other subnetwork acted on by at least one other voltage, the first voltage being higher than the at least one other voltage, and the first subnetwork and the at least one other subnetwork having a shared first ground connection, the diagnostic device including at least one second ground connection, and processing circuitry programmed to perform a diagnostic function, the method comprising:
obtaining, by the processing circuitry, a measurement of a current flow via the at least one second ground connection; and diagnosing, by the processing circuitry performing the diagnostic function, a disturbance in at least one of the shared first ground connection and the at least one second ground connection on the basis of the obtained measurement and as a function of whether the internal combustion engine is started in one of a cold start condition or a warm start condition.

\* \* \* \* \*